United States Patent [19]

Oritani

[11] Patent Number: 4,636,742
[45] Date of Patent: Jan. 13, 1987

[54] CONSTANT-CURRENT SOURCE CIRCUIT AND DIFFERENTIAL AMPLIFIER USING THE SAME

[75] Inventor: Atsushi Oritani, Yokohama, Japan
[73] Assignee: Fujitsu Limited, Kanagawa, Japan
[21] Appl. No.: 665,877
[22] Filed: Oct. 29, 1984
[30] Foreign Application Priority Data
Oct. 27, 1983 [JP] Japan .................................. 58-200045
[51] Int. Cl.[4] ............................................. H03F 1/30
[52] U.S. Cl. .................................. 330/256; 330/277; 330/289
[58] Field of Search ............... 330/252, 253, 256, 257, 330/277, 289, 288; 307/297, 310; 323/315, 316

[56] References Cited

U.S. PATENT DOCUMENTS 3,419,810 12/1968 Xylander ............................. 330/256
3,431,508 3/1969 Soltz et al. ...................... 330/256 X
3,886,435 5/1975 Steckler .......................... 307/310 X Primary Examiner—Eugene R. LaRoche
Assistant Examiner—Steven J. Mottola
Attorney, Agent, or Firm—Armstrong, Nikaido, Marmelstein & Kubovcik

[57] ABSTRACT

A constant-current source circuit and a differential amplifier using the same. The temperature compensation of the output current of the constant-current source circuit is effected by using the threshold voltage characteristic of a transistor such as a MOS transistor or a bipolar transistor. The constant-current source circuit includes one or more constant-current source circuit units. When the constant-current source circuit includes two constant-current source circuit units, one of the units has a positive temperature coefficient and the other has a negative temperature coefficient. The output currents of these two units are combined by a current synthesizing circuit so as to realize any desired temperature characteristic.

6 Claims, 10 Drawing Figures

CONSTANT-CURRENT SOURCE CIRCUIT AND DIFFERENTIAL AMPLIFIER USING THE SAME

BACKGROUND OF THE INVENTION

1. Field of the Invention

The present invention relates to a constantcurrent source circuit which can generate a current output having any desired temperature characteristics and to a differential amplifier which uses the above constant-current source circuit so as to ensure a stable temperature characteristic of, for example, the potentials of its logic output signals.

2. Description of the Prior Art

A constant-current source circuit can generate a current relatively stable against variations of power supply voltage, but not that stable against variations in the ambient temperature.

A constant-current source circuit is typically used in an emitter-coupled-logic (ECL) circuit. Even a slight change in the current of the constant-current source circuit will result in a change in the logic level voltages of the output signal of the ECL circuit, especially when many ECL circuits are coupled in cascade, thereby reducing the voltage margin of the ECL circuit.

To overcome this problem, in a conventional constant current source circuit used in an ECL circuit, the temperature characteristic of the output current is compensated for by using the temperature characteristic of the forward-biased voltage of a diode or of the base-emitter voltage of a bipolar transistor. In another constant current circuit using metal oxide semiconductor (MOS) transistors, the output current is stabilized by using a negative feedback circuit.

In these conventional constant current source circuits, however, it has still been impossible to make the temperature coefficient of the output current completely zero or any desired value.

SUMMARY OF THE INVENTION

The present invention adopts the idea of synthesizing the outputs of a plurality of constant-current source circuit units, having different temperature coefficients, in a constant-current source circuit.

It is an object of the present invention to completely compensate for the temperature characteristic of the output current of a constant-current source circuit or to adjust it to a desired characteristic.

It is another object of the present invention to completely compensate for the temperature characteristic of a circuit using a constant-current source circuit or to adjust the temperature characteristic of the circuit to a desired one.

According to the present invention, there are provided a constant-current source circuit and a differential amplifier using the same, the constant-current source circuit including a constant-current source circuit unit having a positive temperature coefficient; a constant-current source circuit unit having a negative temperature coefficient; and a current synthesizing circuit for synthesizing the output currents of these constant-current source circuit units.

According to the present invention there is also provided a differential amplifier including a pair of transistors whose drains or collectors are connected to a power terminal via load elements, whose gates or bases receive input signals, and whose sources or emitters are commonly connected; and a constant-current source circuit connected to the commonly connected sources or emitters, the constant-current source circuit having a characteristic that a current flowing therethrough increases in accordance with a temperature rise.

DESCRIPTION OF THE PREFERRED EMBODIMENTS

Figure 1:
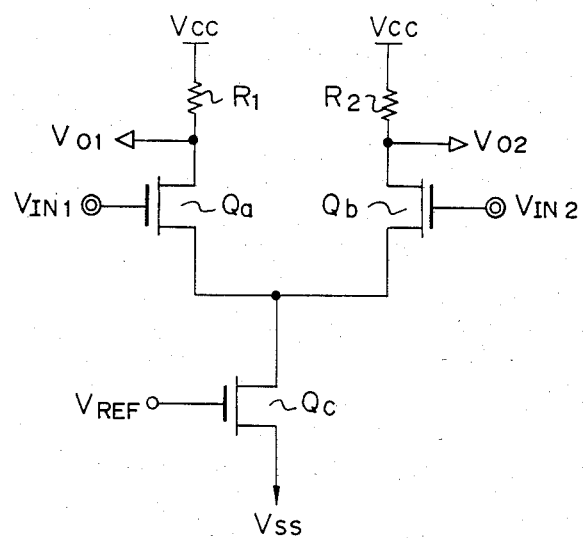
FIG. 1 is a circuit diagram of a conventional differential amplifier.
Figure 2:
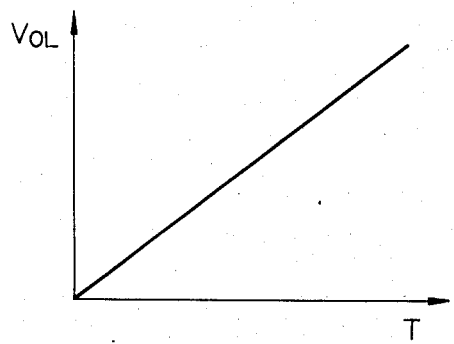
FIG. 2 is a graph of a temperature characteristic of the circuit of FIG. 1.

Before describing the preferred embodiments, an explanation will be given of a conventional differential amplifier in reference to FIGS. 1 and 2. As illustrated in FIG. 1, a conventional amplifier includes transistors $Q_a$ and $Q_b$, whose sources are mutually connected, a transistor $Q_c$ for a constant-current source, and load resistors $R_1$ and $R_2$. The drain of the transistor $Q_c$ is connected to the commonly connected sources of the transistors $Q_a$ and $Q_b$, and the source and the gate of the transistor $Q_c$ are connected to a power source $V_{SS}$ and a reference voltage $V_{REF}$, respectively.

In the circuit of FIG. 1, the high level voltage $V_{OH}$ of each of output signals $V_{01}$ and $V_{02}$ is approximately equal to a power supply voltage $V_{CC}$. The low level voltage $V_{OL}$ of each output signal $V_{01}$ or $V_{02}$ depends on the impedances of the transistor $Q_a$ or $Q_b$ and the transistor $Q_c$. For example, when an input signal $V_{IN1}$ is low and an input signal $V_{IN2}$ is high, the transistor $Q_b$ is turned on and the output signal $V_{02}$ becomes low. In this condition, a current flows from the power $V_{CC}$ through the resistor $R_2$ and the transistors $Q_b$ and $Q_c$ to the power source $V_{SS}$, and the voltage of the output signal $V_{02}$ depends on the impedance of the transistors $Q_b$ and $Q_c$ and the resistor $R_2$.

In general, however, the impedance of the turned-on MOS transistors $Q_b$ and $Q_c$ increases in accordance with a temperature rise, because the carrier mobility in the channel region becomes small when the ambient temperature is high. Therefore, as illustrated in FIG. 2, the low level voltage $V_{OL}$ of the output signal of the circuit of FIG. 1 increases in accordance with the rise of the ambient temperature T.

According to the present invention, there is provided an improved constant-current source circuit which can be used, for example, in a differential amplifier to overcome the above-mentioned problems of the conventional circuit.

Figure 3:
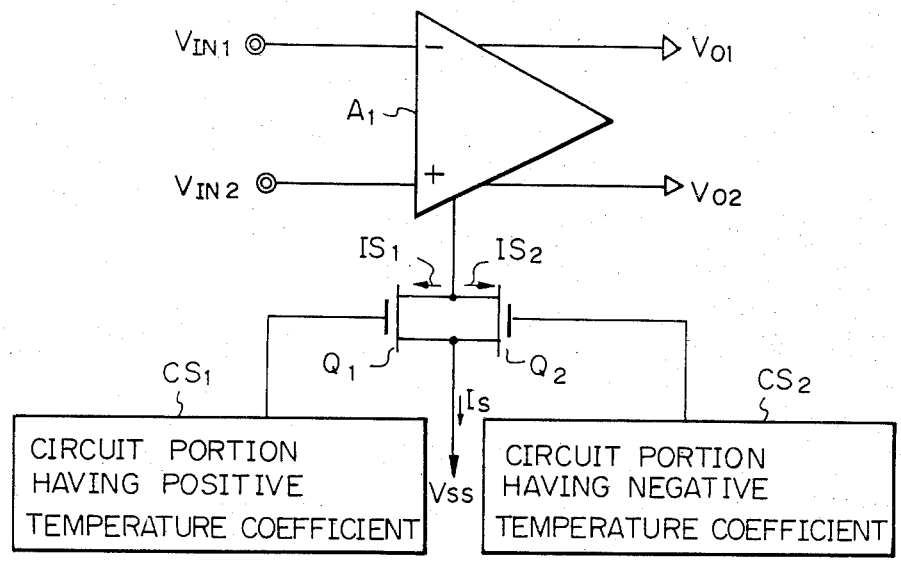
FIG. 3 is a block circuit diagram of the principle of a constant-current source circuit according to the present invention.

FIG. 3 illustrates the principle of a constant-current source circuit in an embodiment of the present invention. The circuit of FIG. 3 comprises a differential circuit $A_1$ such as a current switch or a differential amplifier, a parallel circuit of MOS transistors $Q_1$ and $Q_2$ inserted between the common emitter or the common source of the differential circuit $A_1$ and a power source $V_{SS}$, a constant-current source circuit unit $CS_1$ which is connected to the gate of the transistor $Q_1$ and which has a positive temperature coefficient, and a constant-current source circuit unit $CS_2$ which is connected to the gate of the transistor $Q_2$ and which has a negative temperature coefficient. The constant-current source circuit units $CS_1$ and $CS_2$ may be combined with the transistors $Q_1$ and $Q_2$, respectively, to constitute a constant-current source circuit or may supply control voltages to the gates of the transistors $Q_1$ and $Q_2$ to control the output current of these transistors, respectively.

Figure 4:
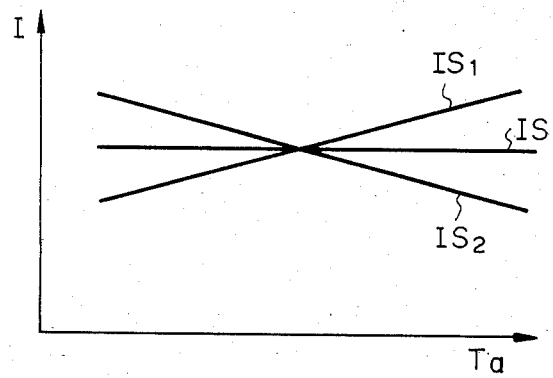
FIG. 4 is a graph of the temperature characteristic of the circuit of FIG. 3.

In the circuit of FIG. 3, since the drain current $IS_1$ of the transistor $Q_1$ is controlled by the constant-current source circuit unit $CS_1$, the drain current $IS_1$ has, as shown in FIG. 4, a positive temperature coefficient. The drain current $IS_2$ has a negative temperature coefficient, because it is controlled by the constant-current source circuit unit $CS_2$. Therefore, it is possible to obtain an output current IS having a zero temperature coefficient, as shown in FIG. 4, or any desired temperature coefficient by synthesizing these current $IS_1$ and $IS_2$ using a current synthesizing circuit constituted of the transistors $Q_1$ and $Q_2$.

Figure 5:
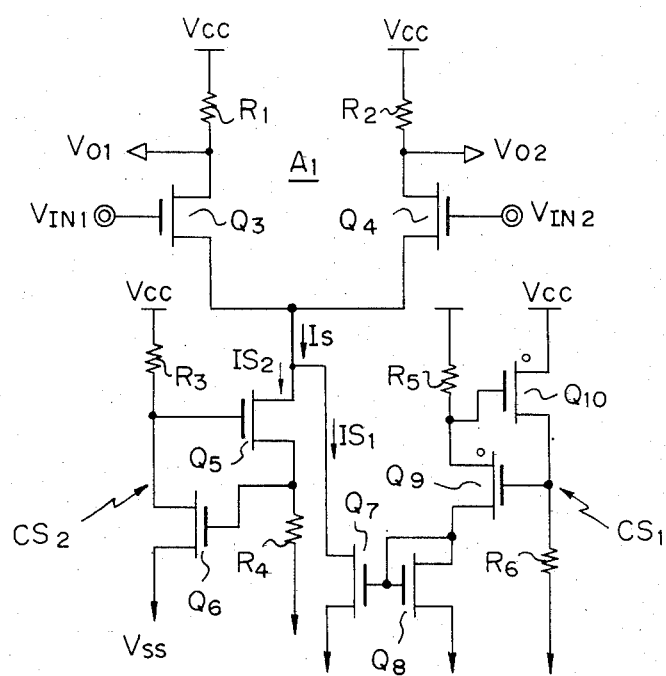
FIG. 5 is a circuit diagram of a differential amplifier which uses a constant-current source circuit in an embodiment of the present invention.

FIG. 5 illustrates a detailed structure of a differential amplifier which uses a constant-current source circuit in an embodiment of the present invention. The circuit of FIG. 5 includes a differential circuit $A_1$ having differential transistors $Q_3$ and $Q_4$ whose sources are commonly connected to each other and load resistors $R_1$ and $R_2$; N-channel MOS transistors $Q_5$ and $Q_6$, and resistors $R_3$ and $R_4$ constituting a constant-current source circuit unit $CS_2$ which is connected to the common source of the transistors $Q_3$ and $Q_4$ and which has a negative temperature coefficient; N-channel MOS transistor $Q_8$, P-channel MOS transistors $Q_9$ and $Q_{10}$, and resistors $R_5$ and $R_6$ composing a constant-current source circuit unit $CS_1$ having a positive temperature coefficient; and an N-channel MOS transistor $Q_7$ composing a current synthesizing circuit. The transistor $Q_5$ is used as a part of the current synthesizing circuit and as a part of the constant-current source circuit unit $CS_2$.

Figure 6A:
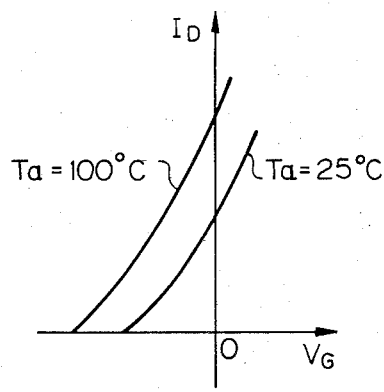
FIGS. 6A and 6B are graphs of the ID-VG characteristics of N-channel MOS transistor and P-channel MOS transistor, respectively.
Figure 6B:
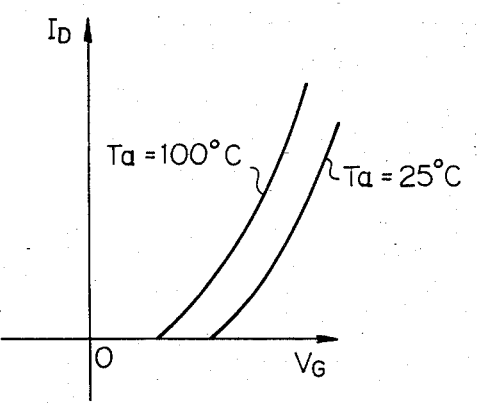

As shown in FIG. 6A, the drain current $I_D$ of each of the P-channel MOS transistors $Q_9$ and $Q_{10}$ of the constant-current source circuit unit $CS_1$ increases (at the same gate voltage $V_G$) in accordance with a temperature rise. This is because, in a P-channel MOS transistor, the higher the temperature, the smaller the probability of activation of holes in the channel area and thus the greater the absolute value of the threshold voltage. Therefore, the higher the temperature, the more current flows through the resistor $R_5$ and the more current flows through the transistor $Q_8$. Since the transistor $Q_8$ and the transistor $Q_7$ constitute a current mirror circuit, the current $IS_1$ flowing through the transistor $Q_7$ increases in accordance with the temperature rise. Therefore, the constant-current source circuit unit $CS_1$ operates so as to lower the potential of output voltages $V_{01}$ and $V_{02}$ of the differential circuit in accordance with a temperature rise.

In the constant-current source circuit unit $CS_2$, the threshold value of the gate voltage of the N-channel MOS transistor $Q_6$ becomes low in accordance with a temperature rise. This is because, in an N-channel MOS transistor, the higher the temperature, the greater the probability of activation of electrons in a channel area. Therefore, the current flowing through the resistor $R_4$, i.e., the output current $IS_2$ of the constant-current source circuit unit $CS_2$, decreases in accordance with a temperature rise. That is, the constant-current source circuit unit $CS_2$ operates so as to increase the output voltages $V_{01}$ and $V_{02}$ of the differential circuit in accordance with a temperature rise.

By synthesizing the output currents $IS_1$ and $IS_2$ of the two constant-current source circuit units $CS_1$ and $CS_2$ to generate the output current IS, it becomes possible to completely compensate for the temperature characteristic of a constant-current source circuit. It is clearly possible to constitute a constant-current source circuit having any temperature coefficient by changing the gm ratio of the transistors $Q_7$ and $Q_8$.

In the circuit of FIG. 5, since each of the transistors $Q_9$ and $Q_{10}$ and the transistors $Q_5$ and $Q_6$ of the constant-current source circuit units $CS_1$ and $CS_2$ constitutes a negative feedback circuit, the output currents $IS_1$ and $IS_2$ are clearly stabilized against variations of the power source $V_{CC}$ and the like.

Figure 7:
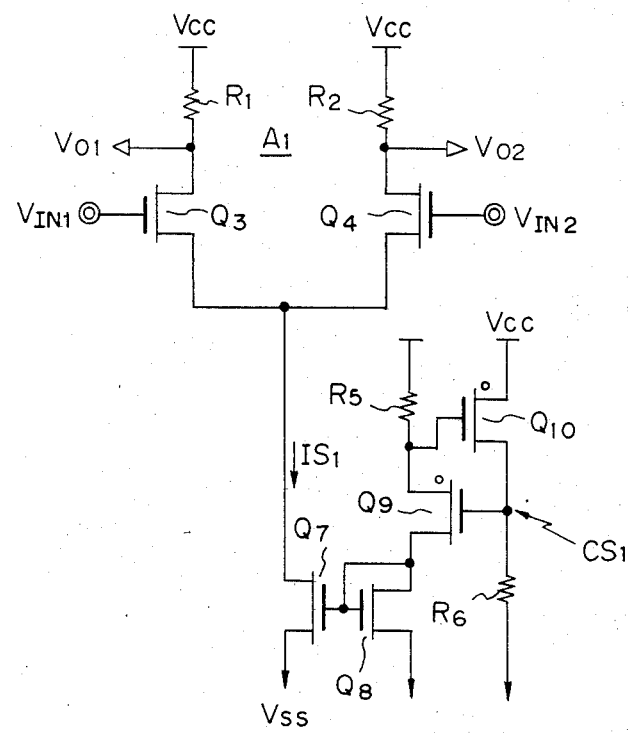
FIG. 7 is a circuit diagram of a differential amplifier which uses a constant-current source circuit in another embodiment of the present invention.

FIG. 7 illustrates a differential amplifier as another embodiment of the present invention. The circuit of FIG. 7 is the same as that of FIG. 5, except that the constant-current source circuit unit $CS_2$ of FIG. 5 is omitted.

As mentioned earlier, since the output current $IS_1$ of the constant-current source circuit unit $CS_1$ increases in accordance with a temperature rise, it is possible to stabilize the output voltage, for example, $V_{02}$ of the differential amplifier of FIG. 7. Since the voltage across the resistor $R_5$ is equal to the threshold voltage Vth(P) of the P-channel MOS transistor $Q_{10}$, the current flowing through the resistor $R_5$, i.e., the transistor $Q_8$ becomes Vth(P)/$R_5$. Therefore, the output voltage $V_{02}$ becomes as follows:

$$V_{02} = V_{CC} - K \cdot Vth(P) \cdot R_2/R_5 \qquad (1)$$

where K is the ratio of gm's of the transistors $Q_7$ and $Q_8$, i.e., K=gm($Q_7$)/gm($Q_8$). Therefore, the variation $dV_{02}$ of the output voltage $V_{02}$ in response to the variation dT of the temperature becomes as follows:

$$(dV_{02}/dT) = (R_2/R_5) \cdot K \cdot (dVth (P)/dT) \qquad (2)$$

Since the ratio dVth(P)/dT is approximately 1.2 mV/°C. and is constant in the case of any MOS transistor and since the gm ratio K is also constant, the gradient of the output voltage $V_{02}$ can be adjusted to any value by adjusting the resistance of the resistors $R_2$ and $R_5$.

Figure 8:
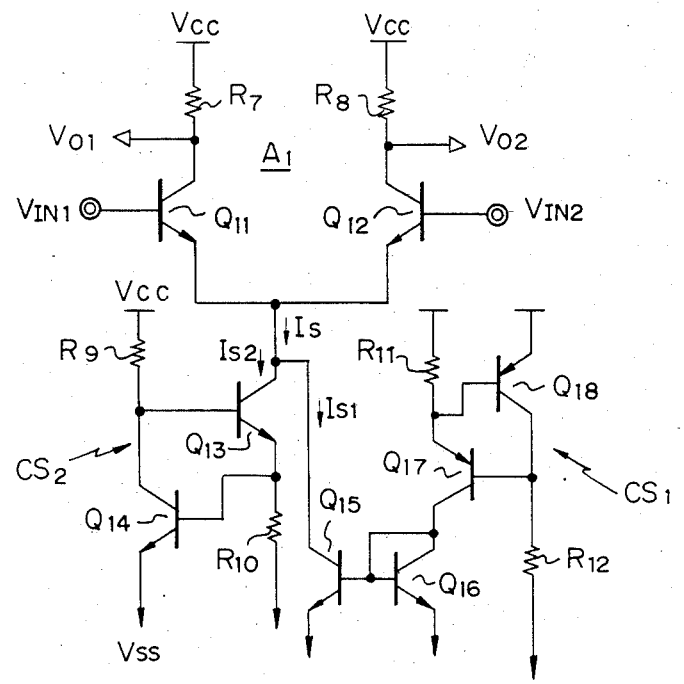
FIG. 8 is a circuit diagram of a differential amplifier which uses a constant-current source circuit in still another embodiment of the present invention.

FIG. 8 illustrates a differential amplifier using a constant-current source circuit in another embodiment of the present invention. The circuit of FIG. 8 corresponds to the circuit of FIG. 5, except the P-channel MOS transistors are replaced by PNP-type bipolar transistors and the N-channel MOS transistors are replaced by NPN-type bipolar transistors. Since the threshold value characteristic of a PNP-type bipolar transistor, i.e., the base voltage to collector current characteristic thereof, is similar to the threshold value characteristic of a P-channel MOS transistor and since the threshold value characteristic of an NPN-type bipolar transistor is similar to the threshold value characteristic of an N-channel MOS transistor, it is clearly possible to obtain a characteristic similar to that of the circuit of FIG. 5 in the circuit of FIG. 8.

Figure 9:
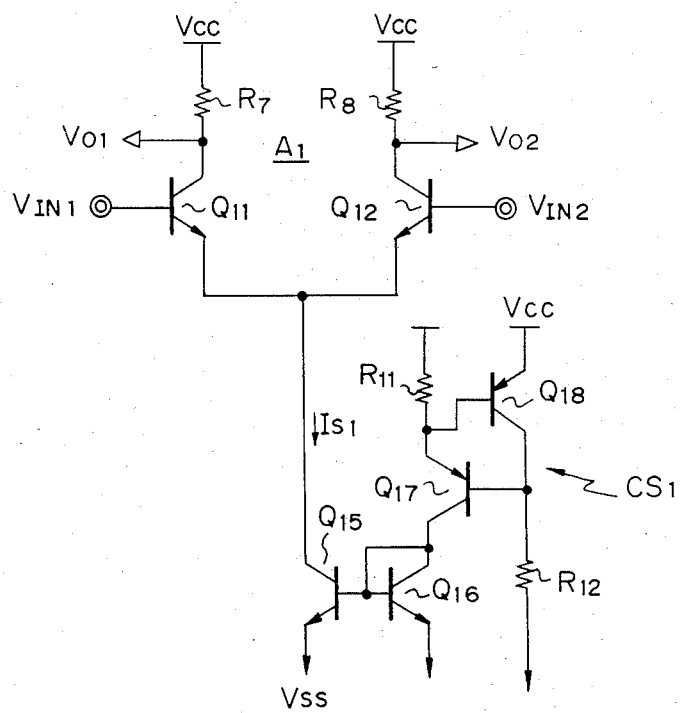
FIG. 9 is a circuit diagram of a differential amplifier using a constant-current source illustrating a further embodiment of the present invention.

FIG. 9 illustrates a differential amplifier using a constant-current source in further embodiment of the present invention. The circuit of FIG. 9 is the same as that of FIG. 8, except that the constant-current source circuit unit CS$_2$ is omitted. The circuit of FIG. 9 corresponds to the circuit of FIG. 7. Thus, a detailed explanation thereof is omitted.

In the above, explanation was made of constant-current source circuits and differential amplifiers using the same. However, it is clear that the principle of the present invention can be adopted not only to a constant-current source circuit but also to a constant-voltage source circuit.

As mentioned above, according to the present invention, generating a current output by synthesizing the output currents of a plurality of constant current source circuit units having different temperature coefficients enables realization of an output current having any desired temperature coefficient in accordance with the charateristic, the condition of usage, and the like of an ECL circuit and so on and enables complete temperature compensation of each parameter of an integrated circuit device and so on.

In a differential amplifier according to the present invention wherein a single constant-current source circuit unit is used, it is possible to effect temperature compensation appropriately by using a simple circuit structure. Since the temperature compensation is effected by using the temperature characteristic of the gate threshold voltage, which is inherent in the kind of a device, such as a MOS transistor or a bipolar transistor, the spread of the temperature characteristic of circuits can be made very small.

I claim:
1. A constant-current source circuit comprising:
    a first transistor constant-current circuit means having an output current with a positive temperature coefficient resulting from temperature characteristics of a threshold voltage of the transistors therein;
    a second transistor constant-current circuit means having an output current with a negative temperature coefficient resulting from temperature characteristics of a threshold voltage of the transistors therein; and
    a current synthesizing circuit means connected to said first and second transistor constant-current circuit means and arranged to snythesize output currents of said means in a selected ratio to provide a constant-current source having an output current with a desired temperature coefficient determined by said selected ratio when said constant current source circuit means is connected in series with another circuit to a potential source.

2. A differential amplifier comprising:
    a constant-current source circuit means including
        a first transistor constant-current circuit means having an output current with a positive temperature coefficient resulting from temperature characteristics of a threshold voltage of the transistors therein,
        a second transistor constant-current circuit means having an output current with a negative temperature coefficient resulting from temperature characteristics of a threshold voltage of the transistors therein, and
        a current synthesizing circuit means connected to said first and second transistor constant-current circuit means and arranged to synthesize output currents of said means in a selected ratio to provide a constant-current source having an output current with a desired temperature coefficient determined by said selected ratio and;
    a pair of differential transistors each having a signal input terminal, a signal output terminal connected to a high-voltage power terminal through a load element, and a third terminal commonly connected to a low-voltage power terminal through said constant-current source circuit.

3. A differential amplifier comprising:
    a constant-current source circuit means including
        a first transistor constant-current circuit means having an output current with a positive temperature coefficient resulting from temperature characteristics of a threshold voltage of the transistors therein,
        a second transistor constant-current circuit means having an output current with a negative temperature coefficient resulting from temperature characteristics of a threshold voltage of the transistors therein, and
        a current synthesizing circuit means connected to said first and second transistor constant-current circuit means and arranged to synthesize output currents of said means in a selected ratio to provide a constant-current source having an output current with a desired temperature coefficient determined by said selected ratio wherein said constant-current source circuit means further includes
    a series connection of a first P-channel MOS transistor and a first resistor coupled between a high-voltage power terminal and a low-voltage power terminal;
    a series connection of a second resistor and a second P-channel transistor coupled between said high-voltage power terminal and said low-voltage power terminal, the gate of said first P-channel MOS transistor being connected to the connection point of said second resistor and said second P-channel MOS transistor, the gate of said second P-channel MOS transistor being connected to the connection point of said first P-channel MOS transistor and said first resistor;
    a current mirror circuit having a third MOS transistor and a fourth MOS transistor, said third MOS transistor being inserted between said second P-channel MOS transistor and said low-voltage power terminal, and said fourth MOS transistor being inserted between said commonly connected sources and said low voltage power terminal;
    a series connection of a fifth N-channel MOS transistor and a third resistor coupled between said high-voltage power terminal and said low-voltage power terminal; and
    a series connection of a fourth resistor and a sixth N-channel MOS transistor coupled between said commonly connected sources and said low-voltage power terminal, the gate of said fifth N-channel MOS transistor being connected to the connection point of said fourth resistor and said sixth N-channel MOS transistor, the gate of said sixth N-channel MOS transistor being connected to the connection point of said fifth N-channel MOS transistor and said third resistor.

4. A differential amplifier comprising:
a constant-current source circuit means including
a first transistor constant-current circuit means having an output current with a positive temperature coefficient resulting from temperature characteristics of a threshold voltage of the transistors therein,
a second transistor constant-current circuit means having an output current with a negative temperature coefficient resulting from temperature characteristics of a threshold voltage of the transistors therein, and
a current synthesizing circuit means connected to said first and second transistor constant-current circuit means and arranged to synthesize output currents of said means in a selected ratio to provide a constant-current source having an output current with a desired temperature coefficient determined by said selected ratio wherein said constant-current source circuit means further includes
a series connection of a first PNP-type transistor and a first resistor coupled between a high-voltage power terminal and a low-voltage power terminal;
a series connection of a second resistor and a second PNP-type transistor coupled between said high-voltage power terminal and said low-voltage power terminal, the base of said first PNP-type transistor being connected to the connection point of said second resistor and said second PNP-type transistor, the base of said second PNP-type transistor being connected to the connection point of said first PNP-type transistor and said first resistor;
a current mirror circuit having a third transistor and a fourth transistor, said third transistor being inserted between said second PNP-type transistor and said low-voltage power terminal, and said fourth transistor being inserted between said commonly connected emitters and said low-voltage power terminal;
a series connection of a fifth NPN-type transistor and a third resistor coupled between said high-voltage power terminal and said low-voltage power terminal; and
a series connection of a fourth resistor and a sixth NPN-type transistor coupled between said commonly connected emitters and said low-voltage power terminal, the base of said fifth NPN-type transistor being connected to the connection point of said fourth resistor and said sixth NPN-type transistor, the base of said sixth NPN-type transistor being connected to the connection point of said fifth NPN-type transistor and said third resistor.

5. A differential amplifier including a pair of transistors whose drains are connected to a power terminal via load elements, whose gates receive input signals, and whose sources are commonly connected; and a constant-current source circuit connected to said commonly connected sources, said constant-current source circuit having the characteristic that the current flowing therethrough increases in accordance with a temperature rise and wherein said constant-current current source circuit comprises:
a series connection of a first P-channel MOS transistor ($Q_{10}$) and a first resistor ($R_6$) coupled between a high-voltage power terminal and a low-voltage power terminal;
a series connection of a second resistor ($R_5$) and a second P-channel transistor ($Q_9$) coupled between said high-voltage power terminal and said low-voltage power terminal, the gate of said first P-channel MOS transistor ($Q_{10}$) being connected to the connection point of said second resistor ($R_5$) and said second P-channel MOS transistor ($Q_9$), the gate of said second P-channel MOS transistor ($Q_9$) being connected to the connection point of said first P-channel MOS transistor ($Q_{10}$) and said first resistor ($R_6$); and
a current mirror circuit having a third MOS transistor ($Q_8$) and a fourth MOS transistor ($Q_7$), said third MOS transistor ($Q_8$) being inserted between said second P-channel MOS transistor ($Q_9$) and said low-voltage power terminal, and said fourth MOS transistor ($Q_7$) being inserted between said commonly connected sources and said low voltage power terminal.

6. A differential amplifier including a pair of transistors whose collectors are connected to a power terminal via load elements, whose bases receive input signals, and whose emitters are commonly connected; and a constant-current source circuit connected to said commonly connected emitters, said constant-current source circuit having the characteristic that the current flowing therethrough increases in accordance with a temperature rise and wherein said constant-current current source circuit comprises:
a series connection of a first PNP-type transistor ($Q_{18}$) and a first resistor ($R_{12}$) coupled between a high-voltage power terminal and a low-voltage power terminal;
a series connection of a second resistor ($R_{11}$) and a second PNP-type transistor ($Q_{17}$) coupled between said high-voltage power terminal and said low-voltage power terminal, the base of said PNP-type transistor ($Q_{18}$) being connected to the connection point of said second resistor ($R_{11}$) and said second PNP-type transistor ($Q_{17}$), the base of said second PNP-type transistor ($Q_{17}$) being connected to the connection point of said first PNP-type transistor ($Q_{18}$) and said first resistor ($R_{12}$); and
a current mirror circuit having a third transistor ($Q_{16}$) and a fourth transistor ($Q_{15}$), said third transistor ($Q_{16}$) being inserted between said second PNP-type transistor ($Q_{17}$) and said low-voltage power terminal, and said fourth transistor ($Q_{15}$) being inserted between said commonly connected emitters and said low-voltage power terminal.

* * * * *